Nov. 9, 1965 R. J. ROWLEY ETAL 3,217,269
CRYSTAL CONTROLLED MULTIVIBRATOR
Filed May 4, 1962
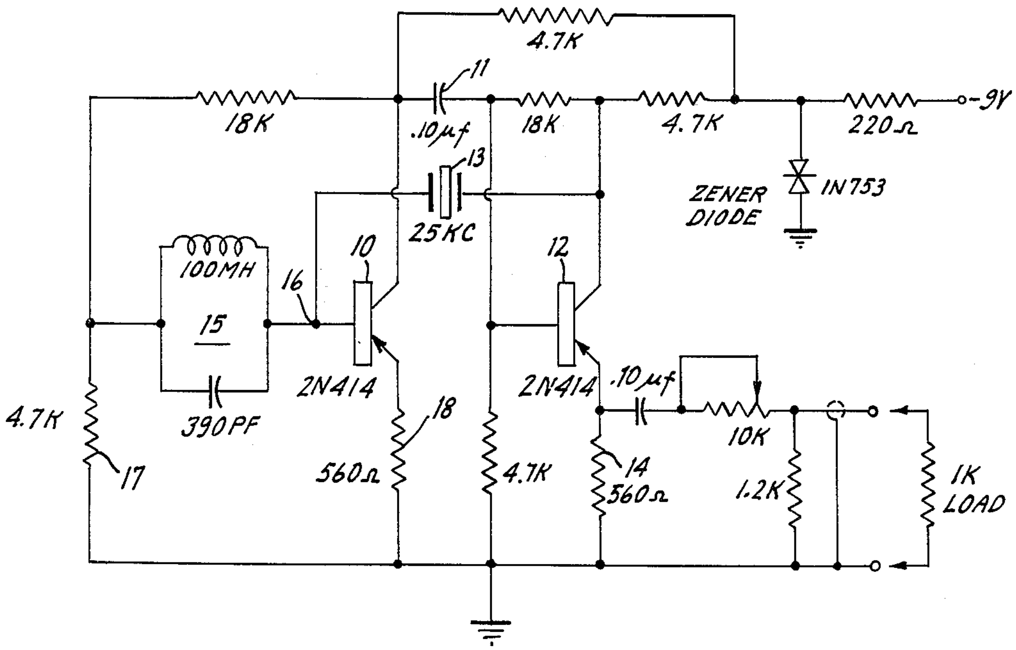
INVENTORS
ROBERT J. ROWLEY
MARIO V. MONCADA
BY
Fordyce A. Bothwell
ATTORNEY United States Patent Office 3,217,269

Patented Nov. 9, 1965

3,217,269
CRYSTAL CONTROLLED MULTIVIBRATOR

Robert J. Rowley, Sunnyvale, and Mario V. Moncada, San Francisco, Calif., assignors to Philco Corporation, Philadelphia, Pa., a corporation of Delaware Filed May 4, 1962, Ser. No. 192,433
3 Claims. (Cl. 331—113)

This invention relates to oscillators of the multivibrator type employing first and second transistor stages and a feedback connection including a crystal between the collector of the second transistor and the input circuit of the first transistor, said crystal being cut to series resonate at the operating frequency.

For some purposes there has existed a need for a highly stable oscillator having an output which is rich in harmonics. For example there has been a need for such an oscillator in a frequency selective voltmeter.

One object of the present invention is to provide an improved oscillator in fulfillment of said need.

Another object of the invention is to provide an improved square wave oscillator which has good voltage stability and which is relatively insensitive to voltage and temperature changes or to replacement of parts.

A further object of the invention is to provide a two-stage oscillator of the above-mentioned type having the desired stability.

The two-stage crystal-controlled oscillator of this invention is novelly characterized in that a parallel resonant circuit is provided in the input circuit of the first transistor between the feedback junction and the emitter. This parallel resonant circuit, like the crystal, is resonant at the operating frequency of the oscillator and it provides a high impedance for driving the first transistor through the feedback circuit. This feature and the use of an unbypassed emitter resistor of relatively low value in the input circuit of the first transistor provides an oscillator having the desired high stability.

The invention may be fully understood from the following detailed description with reference to the accompanying drawing wherein the single figure is a schematic illustration of a square wave oscillator according to a preferred embodiment of the invention as employed as a reference oscillator in a frequency selective voltmeter.

Referring more particularly to the drawing, the oscillator shown comprises two transistor stages connected to form a multivibrator. The collector of the first transistor 10 is connected through capacitor 11 to the base of the second transistor 12. A feedback connection including a piezo-electric crystal 13 extends from the collector of transistor 12 to the base lead of transistor 10. The crystal is cut to series resonate at the operating frequency which in this instance is 25 kc. The output of the oscillator is derived from across the emitter resistor 14 of the second transistor.

In accordance with the present invention, a parallel resonant circuit or tank 15, tuned to the operating frequency, is connected in the input circuit of transistor 10 between the feedback junction 16 and the stabilizing bias resistor 17. Because of the low frequency the crystal series resonant impedance is very high, i.e. on the order of 30,000 ohms, and this impedance is in series with the tank impedance and resistor 17 to ground. Without the tank 15, the impedance of the crystal would be in series with resistor 17 to ground, and due to the large voltage drop acros the crystal only a small amount of the feedback signal would appear in the input circuit of transistor 10. However the tank provides a high impedance at the operating frequency between the base and ground for driving transistor 10 through the feedback circuit. Thus the tank greatly reduces the attenuation in the feedback circuit. Moreover the unbypassed emitter resistor 18 also increases the normal input impedance of transistor 10.

As a result of this circuit arrangement the oscillator is highly stable and is not appreciably affected by voltage and temperature variations or replacement of parts. For example, the transistors may be replaced without requiring any circuit adjustments.

The oscillator operates in a manner similar to that of a free running multivibrator. Conduction in transistor 10 causes the potential at the collector thereof to rise toward ground, thus cutting off transistor 12 in the following stage. When coupling capacitor 11 discharges to the point that conduction resumes in transistor 12, the rise in voltage at the collector of transistor 12 is coupled back through crystal 13 to the base of transistor 10. This lessens conduction through transistor 10. The reduction in conduction of transistor 10 causes the potential at the collector thereof to decrease thereby initiating the well-known regenerative cycle which turns transistor 12 full on and causes transistor 10 to be cut off. The inclusion of crystal 13 and tuned circuit 15 causes the feedback from the second stage to the first stage to be a maximum at the frequency at which crystal 13 is series resonant and circuit 15 is parallel resonant. That is, since crystal 13 and circuit 15 form two elements of a voltage divider which also includes resistor 17, the increase in impedance of crystal 13 and the decrease in impedance of circuit 15 for frequencies off resonance will reduce sharply the fraction of the feedback voltage present at the collector of transistor 12 which is supplied to the base of transistor 10. This will force the circuit to oscillate at the series resonant frequency of crystals 13, i.e. the frequency at which the feedback is a maximum.

While the square wave oscillator of this invention is intended for any use to which it may be applicable, it is particularly well suited for use in a frequency selective voltmeter wherein it may serve as the reference oscillator. It has been so used experimentally and has been found to fulfill the aforementioned need therein.

While a preferred embodiment of the invention has been illustrated and described, it will be understood that the invention is not limited thereto but contemplates such modifications and further embodiments as may occur to those skilled in the art.

We claim:

1. A free-running multivibrator circuit for producing a substantially square wave voltage of stable frequency, comprising first and second transistors each having base, emitter and collector electrodes, and circuit means comprising: a resistor connected between the emitter electrode of the first transistor and a point of fixed reference potential, means for biasing the base electrode of said first transistor including a resistor having one end connected to said point of fixed reference potential, a parallel resonant circuit connected between the other end of the last-mentioned resistor and the base electrode of said first transistor, said resonant circuit being in series relation with said last-mentioned resistor in the input circuit of said first transistor and being tuned to the selected operating frequency of the oscillator, means coupling the collector electrode of said first transistor to the base electrode of said second transistor, a feedback connection including a crystal between the collector electrode of said second transistor and the base electrode of said first transistor, said crystal being cut to series resonate at said selected operating frequency, said resonant circuit serving to reduce the attenuation of the feedback signal in the input circuit of said first transistor, a resistor connected between the emitter electrode of said second transistor and said point of fixed reference potential, and means for deriving the square wave output voltage from across the latter resistor.

2. A free-running multivibrator circuit for producing a substantially square wave voltage of stable frequency, comprising first and second bias supply terminals, first and second transistor stages each comprising a transistor having base, emitter and collector electrodes, a first load impedance connected between said emitter electrode and said first bias supply terminal, a second load impedance connected between said collector and said second bias supply terminal, and a resistive bias network connected between said first and second bias supply terminals, said multivibrator circuit further comprising means connecting the base electrode in said second stage to an intermediate point on said bias network of said second stage, a crystal series-resonant at the selected operating frequency of said multivibrator circuit and connected between the collector electrode of said second stage and the base electrode of said first stage, a circuit parallel resonant at said series resonant frequency of said crystal and connected between the base electrode of said first stage and an intermediate point on said bias network of said first stage, a capacitor connected between the collector electrode of said first stage and the base electrode of said second stage, and means for deriving an output from across one of said load impedances of one of said stages.

3. A multivibrator circuit in accordance with claim 2 wherein said first and second load impedances of said first and second stages are each resistors, and wherein said means for deriving an output is connected across said first load impedance of said second stage.

References Cited by the Examiner

UNITED STATES PATENTS

| | | | |
|---|---|---|---|
| 2,625,650 | 1/53 | Spencer | 331—159 X |
| 2,718,593 | 9/55 | Felix | 331—144 X |

OTHER REFERENCES

"Basic Theory and Application of Transistors," Department of The Army Technical Manual, TM11-690, Washington, D.C., March 17, 1959, pages 88–90.

McLeod, D. D.: "A Multivibrator-Controlled Sinusoidal Oscillator." In Electronic Engineering. Pages 724–725, December, 1958.

ROY LAKE, *Primary Examiner.*

JOHN KOMINSKI, *Examiner.*